United States Patent
Kloeck et al.

[11] Patent Number: 5,243,861
[45] Date of Patent: Sep. 14, 1993

[54] CAPACITIVE TYPE SEMICONDUCTOR ACCELEROMETER

[75] Inventors: Benjamin Kloeck, Hitachi; Seiko Suzuki, Hitachioota; Shigeki Tsuchitani, Mito; Masayuki Miki, Katsuta; Masahiro Matsumoto, Hitachi; Kazuo Sato, Tokyo; Akira Koide, Choufu; Norio Ichikawa, Mito; Yukiko Kawai, Katsuta; Hiromichi Ebine, Oomiya, all of Japan

[73] Assignees: Hitachi, Ltd., Tokyo; Hitachi Automotive Engineering Co., Ltd., Ibaraki, both of Japan

[21] Appl. No.: 755,838

[22] Filed: Sep. 6, 1991

[30] Foreign Application Priority Data

Sep. 7, 1990 [JP] Japan ................................. 2-235539

[51] Int. Cl.$^5$ ............................................. G01P 15/125
[52] U.S. Cl. ................................. 73/517 R; 361/280
[58] Field of Search ........................ 73/517 R, 517 B; 361/280, 283; 257/418, 417

[56] References Cited

U.S. PATENT DOCUMENTS

| | | | |
|---|---|---|---|
| 4,483,194 | 11/1984 | Rudolf | 73/517 R |
| 5,085,079 | 2/1992 | Holdren et al. | 73/517 R |
| 5,095,752 | 3/1992 | Suzuki et al. | 73/517 R |

*Primary Examiner*—John E. Chapman
*Attorney, Agent, or Firm*—Antonelli, Terry, Stout & Kraus

[57] ABSTRACT

A capacitive type semiconductor accelerometer has an intermediate silicon plate of n type conductivity including a movable electrode constituting a pendulum mass formed within the intermediate silicon plate and supported thereby via a beam so as to permit movement in a direction perpendicular to its plane. A first conductive island is formed within the intermediate plate and is immovably supported thereby via a first insulating leg so as to be isolated therefrom, and an upper glass plate is anodic bonded to the intermediate silicon plate. A first stationary electrode is formed on the upper glass plate at the position facing one face of the movable electrode with a predetermined gap. A lower glass plate is anodic bonded to the intermediate silicon plate and a second stationary electrode is formed on the lower glass plate at the position facing the other face of the movable electrode with a predetermined gap. First, second and third pads are disposed in common on the lower glass plate at the outside of the intermediate silicon plate, the first pad being electrically connected to the first stationary electrode via a first thin film lead formed on the lower glass plate and the first conductive island, the second pad being electrically connected to the movable electrode via a second thin film lead formed on the lower glass plate and the intermediate silicon plate and the third pad being electrically connected to the second stationary electrode via a third thin film lead formed on the lower glass plate.

11 Claims, 9 Drawing Sheets

CAPACITIVE TYPE SEMICONDUCTOR ACCELEROMETER

The present invention relates to a capacitive type semiconductor accelerometer for detecting acceleration of a moving body such as an automobile.

BACKGROUND OF THE INVENTION

JP-A-1-152369 (1989) and JP-A-2-134570 (1990) which corresponds to U.S. Pat. Application Ser. No. 07/429,546, now U.S. Pat. No. 5,095,752, disclose conventional capacitive type semiconductor accelerometers in which the detecting arrangement is constituted by laminating three layers, including an upper glass plate, intermediate silicon plate and lower glass plate.

In the above conventional capacitive type semiconductor accelerometers, no sufficient consideration was made in connection with the lead out arrangement of the leads from the stationary electrodes formed on the upper and lower glass plates, such that there were problems with respect to their mass production and reliability.

Hereinbelow problems concerning mass production are enumerated more specifically.

(1) It was necessary to form a through hole in the glass plate for leading out the lead from the stationary electrode formed on the upper glass plate.

(2) The process for forming a conductive portion inside the though hole was complex which was needed for electrical connection between pads for wire bonding and the stationary electrodes.

(3) It was necessary to form a square shaped aperture in a part of the upper glass plate because each pad for the wire bonding was respectively arranged on the upper glass plate, intermediate silicon plate and lower glass plate.

(4) The wire bonding work for electrically connecting the pads to a signal processing circuit was difficult because there were steps between respective pad portions. Further, the formation of the pads via sputtering after anodic bonding of the upper glass plate, intermediate silicon plate and lower glass plate was difficult because of the steps between the pad portions.

(5) It was necessary to completely seal the through hole after the anodic bonding for preventing water and dust from intruding when obtaining a detecting chip for the accelerometer via dicing. Further, for electrically insulating the lead portion of the stationary electrode formed on the lower glass plate from the intermediate silicon plate, grooves were formed on a part of the intermediate silicon plate by anisotropic etching. As a result it was also necessary to completely seal the groove portions formed on the lower face of the intermediate silicon plate by means of an aperture formed in the upper glass plate for further preventing water and dust from intruding through the groove portions.

Further insufficient reliability resulted for the reasons as follows:

When forming the conductive portions inside the through holes such as by sputtering, disconnection of the conductive portions at edges of the through holes is likely to be caused due to slight change of its process condition.

SUMMARY OF THE INVENTION

An object of the present invention is to provide a capacitive type semiconductor accelerometer suitable for mass production and having a high reliability.

For achieving the above object, in accordance with the present invention, the leads from the stationary electrodes are led out in a hermetically sealed manner to the outside without necessitating the through holes and all of the pads are disposed on the lower glass plate.

According to the present invention, by electrically connecting the stationary electrode on the upper glass plate with a lead portion formed on the lower glass plate via a conductive island formed in the intermediate silicon plate by making use of etching technology, the formation of the through hole in the upper glass plate is eliminated.

Further, the leads formed on the lower glass plate are led out in a hermetically sealed manner and connected to the respective pads, therefore intrusion of water and dust during dicing is prevented. The following two new hermetic seals are employed by the present invention. One is to form triangular shaped projections with an insulation layer thereon on the lower face of the intermediate silicon plate by making use of anisotropic etching and to force a collapse of the lead portions made of a soft metal with the projections to thereby electrically insulate the part of the lead from the intermediate silicon plate and to lead out the lead in a hermetically sealed manner. The other is to form an aperture in the intermediate silicon plate by making use of anisotropic etching and thereafter to seal the aperture with an insulating material to thereby electrically insulate the part of the lead from the intermediate silicon plate and to lead out the lead in a hermetically sealed manner.

With the disposition of all of the pads for wire bonding only on the lower glass plate, the pad formation work and the wire bonding work are improved.

Since the pads for wire bonding are disposed only on the lower glass plate, the pad disposed portion is uncovered by cutting off the corresponding part of the upper glass plate above the pads during dicing operation for obtaining the respective detection chips for the accelerometers such that the formation of a square shaped aperture on a part of the upper glass plate is eliminated. As a result any aperture formation on the upper glass plate is eliminated, thereby mass productivity of the capacitive type semiconductor accelerometer is extremely improved.

According to the present invention, as explained above, via the elimination of the aperture formation for the through hole on the upper glass plate, the mass production of the capacitive type semiconductor accelerometer is enhanced. Further, since the measure of leading out the leads without using the through hole is employed, the process of lead formation is simplified. Still further, since the pad disposed portion is open in accessible condition through the dicing operation, the square shaped aperture forming operation on a part of the upper glass plate is eliminated. Still further, since the steps between respective pads are eliminated, the wire bonding work thereto is improved. Still further, since the leads leading out positions are hermetically sealed before completing anodic bonding, the mass productivity of the capacitive type semiconductor accelerometer is enhanced. Moreover, in accordance with the present invention, no through holes are used, and so the troubles, such as the disconnection, are eliminated

EXPLANATION OF THE PREFERRED EMBODIMENTS

Figure 1:
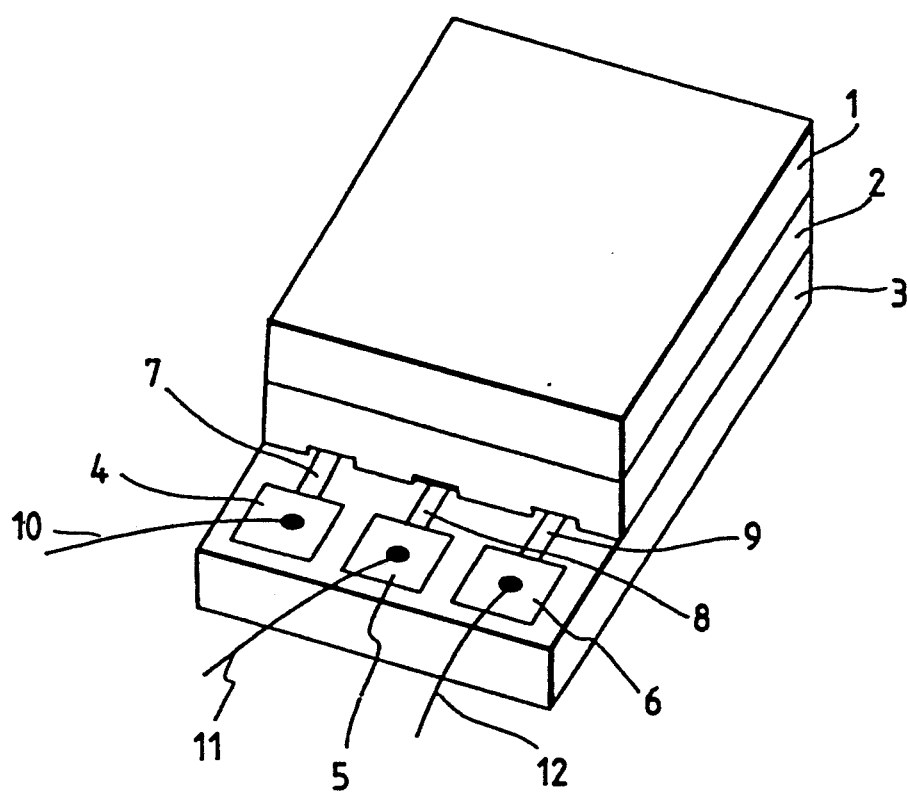
FIG. 1 is a perspective view of one embodiment of a capacitive type semiconductor accelerometer according to the present invention.

Hereinbelow, one embodiment of a capacitive type semiconductor accelerometer according to the present invention is explained with reference to FIG. 1.

Further, throughout the specification, the elements indicated with the same reference numerals denote the same or equivalent elements.

The fundamental structure of the detecting portion in this accelerometer is constituted by three layers, including of an upper glass plate 1, intermediate silicon plate 2 and lower glass plate 3 which are bonded together via anodic bonding after lamination thereof, and only on the lower glass plate 3 are disposed all of pads 4, 5 and 6 for wire bonding. These pads 4, 5 and 6 are electrically connected to electrode portions formed inside the detecting portion via thin film leads 7, 8 and 9 of which detail will be explained later. This accelerometer is connected to a signal processing circuit (not shown) through wire bonding lead wires 10, 11 and 12 such as of gold wire and aluminum wire connected to the respective pads 4, 5 and 6. As seen from the drawing, all of the pads 4, 5 and 6 are disposed on a common plane of the lower glass plate 3 with no steps, in that with no height difference between them, the wire bonding work is facilitated. Further, since an aperture, such as a through hole formation in the upper glass plate, is eliminated, the fundamental structure of the detecting portion is suitable for mass production.

Figure 2:
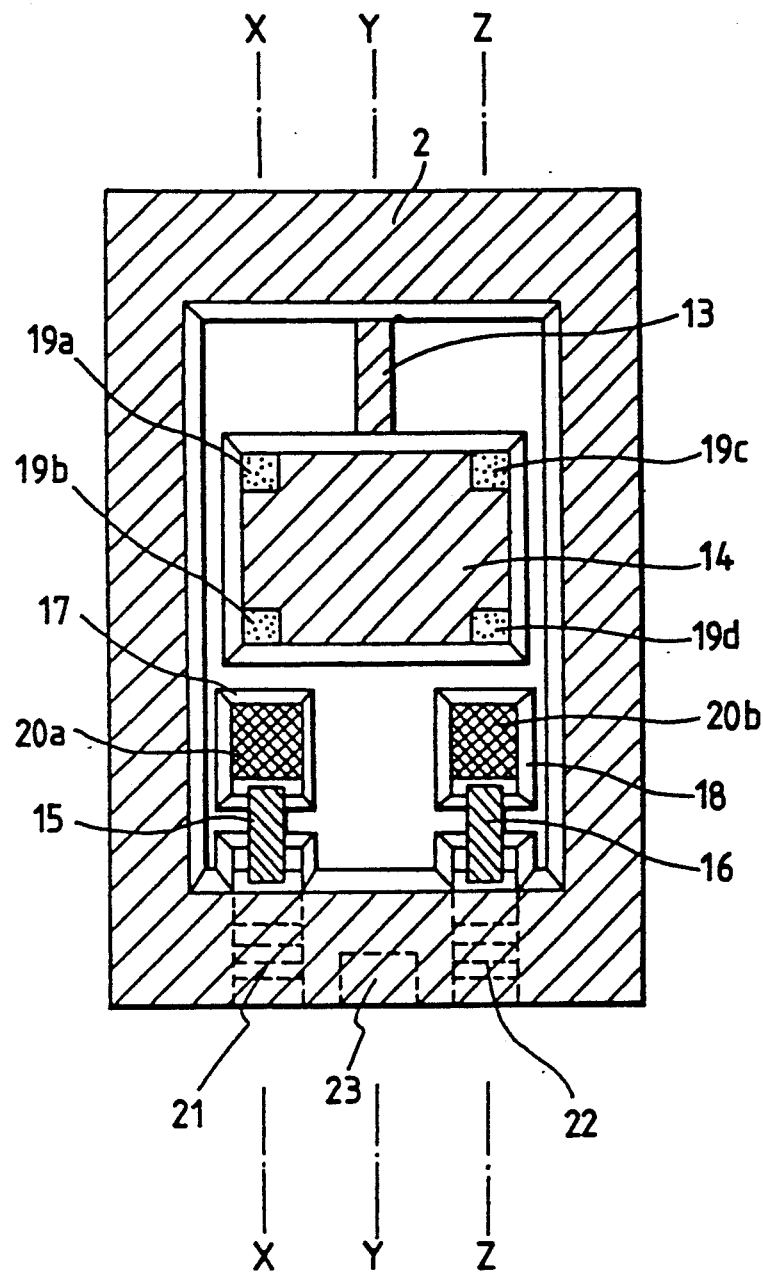
FIG. 2 is a plane view of an intermediate silicon plate used in the embodiment shown in FIG. 1.

FIG. 2 shows a plane view of the intermediate silicon plate 2 shown in FIG. 1. Through repeated anisotropic etching of the silicon plate, a movable electrode 14 supported by a beam 13 and conductive islands 17, and 18, each supported by legs 15 and 16, are formed in the intermediate silicon plate 2. Further, insulating films 19a, 19b, 19c and 19d are formed on parts of a face of the movable electrode 14, and n+ regions 20a and 20b are formed on the respective faces of the conductive islands 17 and 18. Herein, since the intermediate silicon plate 2 is formed of an n type silicon substrate, the n+ region is obtained by diffusing phosphorus onto the corresponding parts thereof. On the back face of the intermediate silicon plate 2 two series of triangular shaped projections 21 and 22 and an n+ region 23 are formed as shown by broken lines.

Figure 3:
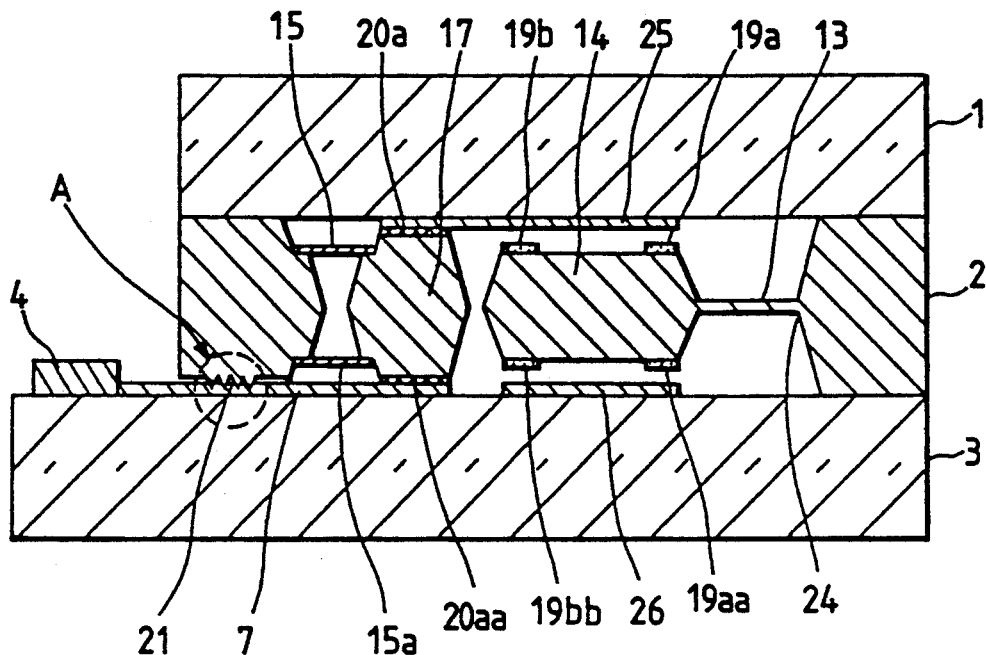
FIG. 3 is a cross section of the embodiment shown in FIG. 1 taken along the line X—X in FIG. 2.

FIG. 3 is the cross section of the embodiment shown in FIG. 1 taken along the line X—X indicated in FIG. 2. After laminating the upper glass plate 1, intermediate silicon plate 2 and lower glass plate 3 in a form of a wafer, the three plates are bonded together via well known anodic bonding. The thickness of the respective plates is about a few hundreds $\mu m$ and the entire thickness of the laminated detecting portion is about 1 mm. The upper glass plate 1 and the lower glass plate 3 are made of a material such as borosilicate glass, for example Pyrex glass, having substantially the same thermal expansion coefficient as that of the intermediate silicon plate 2. The anodic bonding of the laminated body constituting the detecting portion was performed by applying a high voltage of 800 v between the intermediate silicon plate 2 and the upper glass plate 1 and the lower glass plate 3 under atmospheric temperature of 300° C. The movable electrode 14 having a function of pending weight is supported by the beam 13 and is constituted to move up and down around a fixed end 24 of the beam 13 as fulcrum, when acceleration acts on the detecting portion. Stationary electrodes 25 and 26 are respectively formed on the upper and lower glass plates 1 and 3. The stationary electrodes 25 and 26 are thin film conductive members formed by sputtering or evaporating a conductive material such as aluminum, molybdenum and indium tin oxide onto the glass plates, and the thickness of the electrodes is below 1 $\mu m$. The gap distances between the movable electrode 14 and the stationary electrodes 25 and 26 are about a few $\mu m$ and the upper and lower gaps constitute two electric capacitors having capacitances $C_1$ and $C_2$, respectively. When acceleration acts on the detecting portion, the movable electrode displaces up and down depending upon the acceleration, thereby the capacitances $C_1$ and $C_2$ of the upper and lower capacitors change. The insulating films 19a, 19b, 19c and 19d formed on the face of the movable electrode 14 are for preventing the movable electrode 14 from partly sticking to the stationary electrodes 25 and 26 due to static electricity applied to the pads 4, 5 and 6 during assembling of the accelerometer. The conductive island 17 supported by the legs 15 and 15a is immovably sandwiched between the upper glass plate 1 and the lower glass plate 3 during the anodic bonding operation. The respective n+ regions 20a and 20aa formed on the upper and lower faces of the conductive island 17 are firmly secured to the stationary electrode 25 and a portion of the lead 7 by coulomb force induced by a high voltage application during the anodic bonding operation. The legs 15 and 15a are constituted, for example, by a thermal oxidation film, insulation film such as silicon nitride or a P++ element which is obtained by diffusing an impurity such as boron into the silicon substrate. By means of this conductive island 17, an electrical path connecting the stationary electrode 25, n+ region 20a, conductive island 17, n+ region 20aa, lead 7 and pad 4 is formed, thereby the pad 4 for the stationary electrode 25 formed on the upper glass plate 1 can be disposed on the lower glass plate 3. As a result, the lead for the stationary electrode 25 is enabled to be led out to the pad located outside the intermediate silicon plate 2 without forming a through hole in the upper glass plate 1. The series of triangular shaped projections 21 formed on the lower face of the intermediate silicon plate 2 force collapses the corresponding part of the lead 7 by coulomb force induced by a high voltage application during anodic bonding operation to thereby complete hermetic seal of this lead leading out portion. When the material of the leads is selected from soft metals such as aluminum, a satisfactory seal is obtained. The lead 7 is formed via sputtering or evaporation and the thickness thereof is about 1 μm. Further, since an oxidation film is formed on the face of the triangular shaped projections 21, the lead 7 is led out in a hermetically sealed as well as electrically insulated manner from the intermediate silicon plate 2. The details of this lead leading out portion A encircled by a broken line are explained later.

Since the leading out portion is hermetically sealed as explained above, and no water and dust intrude into the gaps between the movable electrode 14 and stationary electrodes 25 and 26 via the lead leading out portion during the dicing operation for obtaining the detecting chip for the individual accelerometer, the reliability of the present accelerometer is enhanced. Further, after anodic bonding, the three laminated layers of the upper glass plate 1, intermediate silicon plate 2 and lower glass plate 3 and before dicing thereof, no further sealing operation at the lead leading out portions is needed thereby to enhance mass production of the present accelerometer.

Figure 4:
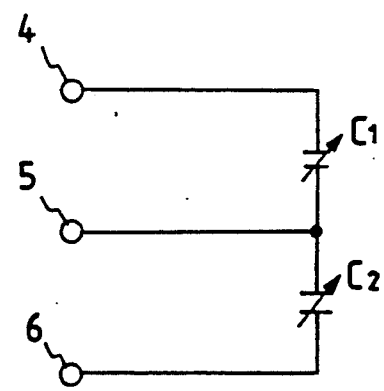
FIG. 4 and FIG. 5 are equivalent circuits of detecting portions in two kinds of capacitive type semiconductor accelerometers.
Figure 5:
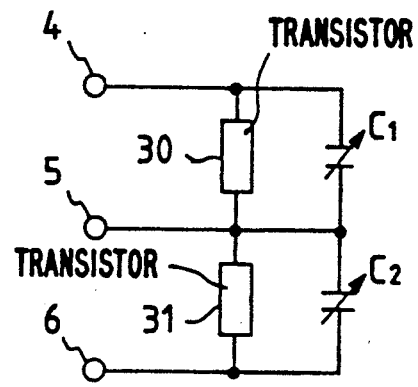

Two kinds of equivalent circuits of the detecting portion for the accelerometer are shown in FIG. 4 and FIG. 5. In the drawings, $C_1$ and $C_2$ show electrical capacitances of the two capacitors formed between the movable electrode 14 and stationary electrodes 25 and 26 and are connected to the signal processing circuit via the pads 4, 5 and 6. FIG. 4 shows an equivalent circuit of the detecting circuit wherein the legs 15 and 16 supporting the conductive islands 17 and 18 are constituted for example by a thermal oxidation film or an insulation film such as silicon nitride, and FIG. 5 shows another equivalent circuit thereof wherein the legs 15 and 16 supporting the conductive islands 17 and 18 are constituted by a P++ element. In FIG. 5 elements 30 and 31 show npn transistors determined by the legs.

One example of signal processing methods applicable to the present accelerometer is to detect acceleration based upon changes of the capacitances $C_1$ and $C_2$, and another example thereof is to detect acceleration by restricting the position of the movable electrode through servo controlling electrostatic force so as to always maintain the capacitance difference $\Delta C = C_1 - C_2$ to be zero.

Figure 6:
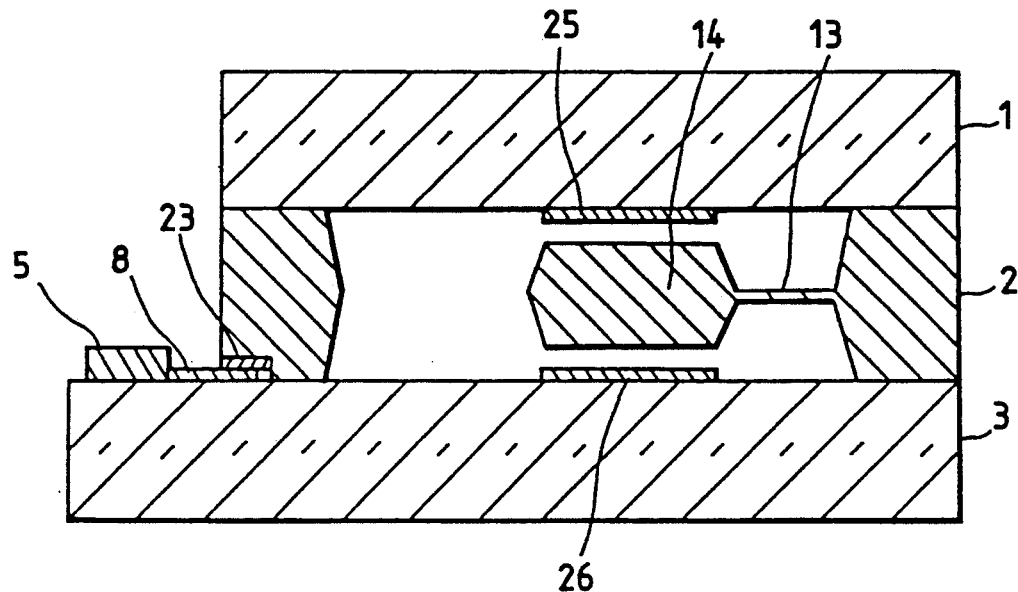
FIG. 6 is a cross section of the embodiment shown in FIG. 1 taken along the line Y—Y in FIG. 2.

FIG. 6 is the cross section of the embodiment shown in FIG. 1 taken along the line Y—Y indicated in FIG. 2. The movable electrode 14 is electrically connected to the pad 5 via the beam 13, the intermediate silicon plate 2, n+ region 23 and the lead 8. Via the coulomb force induced by a high voltage application during anodic bonding the n+ region 23 is firmly secured to the lead portion 8.

Figure 7:
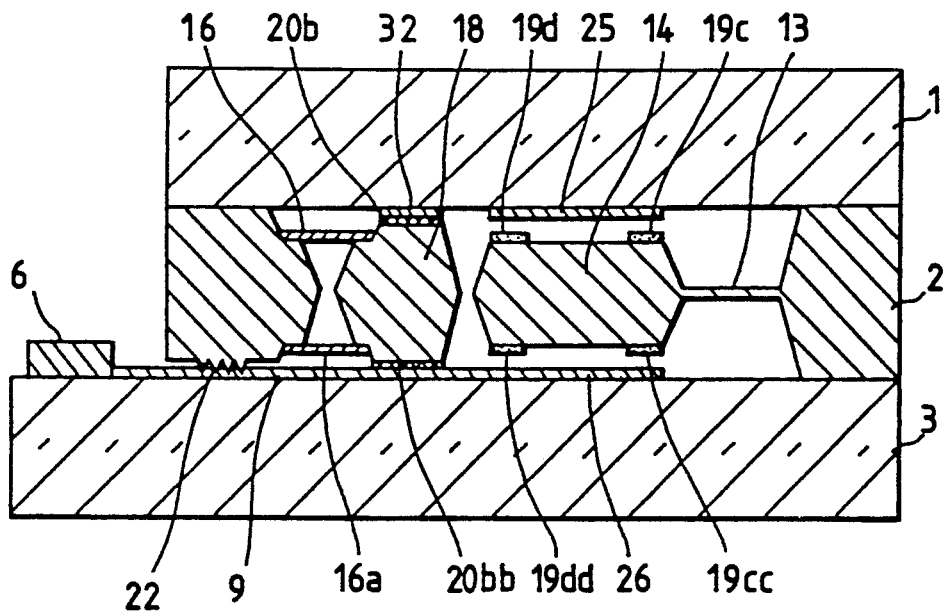
FIG. 7 is a cross section of the embodiment shown in FIG. 1 taken along the line Z—Z in FIG. 2.

FIG. 7 is the cross section of the embodiment shown in FIG. 1 taken along the line Z—Z indicated in FIG. 2. In the drawing, numerals 19cc and 19dd are insulating films, 20bb and n+ region, 16a a leg, 32 a metal thin film made of the same material as the stationary electrodes. The stationary electrode 26 is electrically connected to the pad 6 via the lead 9. The leading out portion of the lead 9 is hermetically sealed with the series of rectangular shaped projections 22 formed on the corresponding lower face of the intermediate silicon plate 2. The metal thin film 32 is an independent element and is separated from the stationary electrode 25. For achieving the equivalent circuit shown in FIG. 4, the conductive island 18 can be removed, however for achieving the equivalent circuit shown in FIG. 5, the conductive island 18 is necessary for providing the transistor 31 and for realizing a balance of the equivalent circuit.

Figure 8:
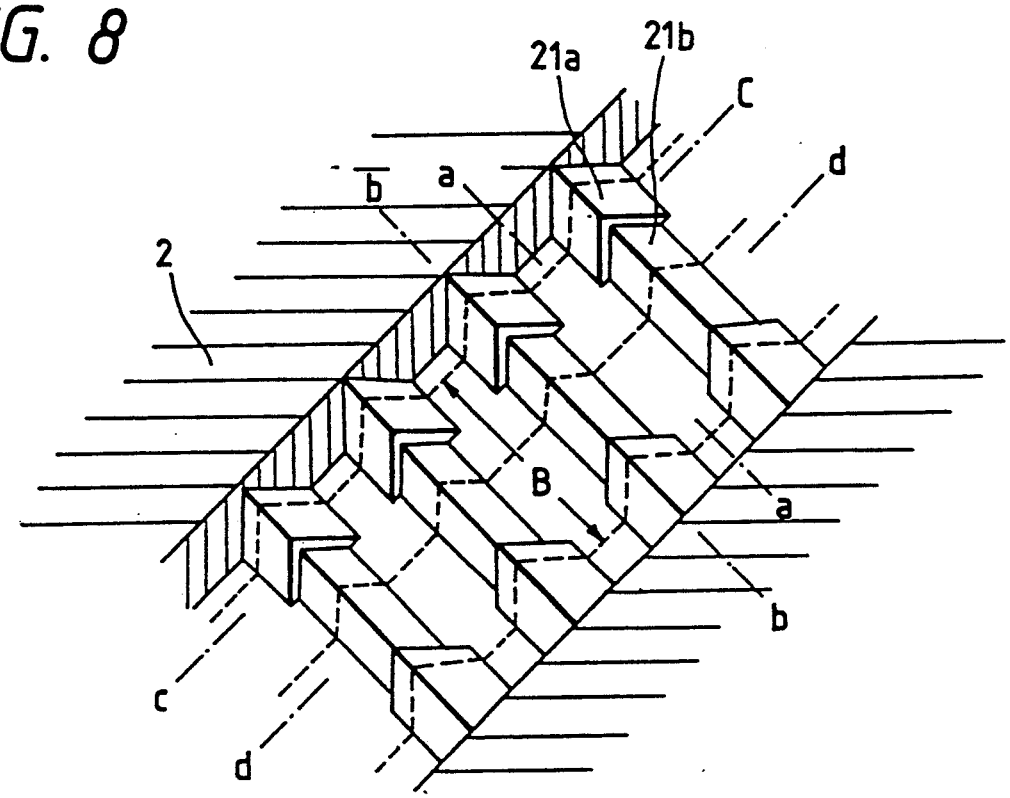
FIG. 8 shows an enlarge perspective view of the lead leading out portion indicated by A in FIG. 3 while removing the lower glass plate.
Figure 9:
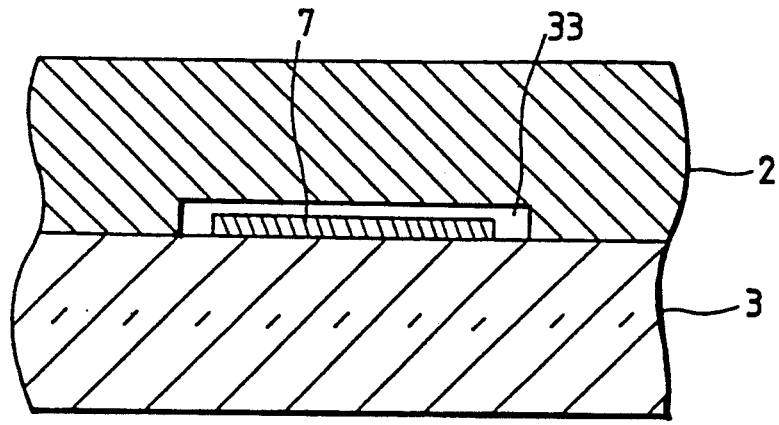
FIG. 9 is a cross section of the lead leading out portion including the lower glass plate taken along the line a—a in FIG. 8.
Figure 10:
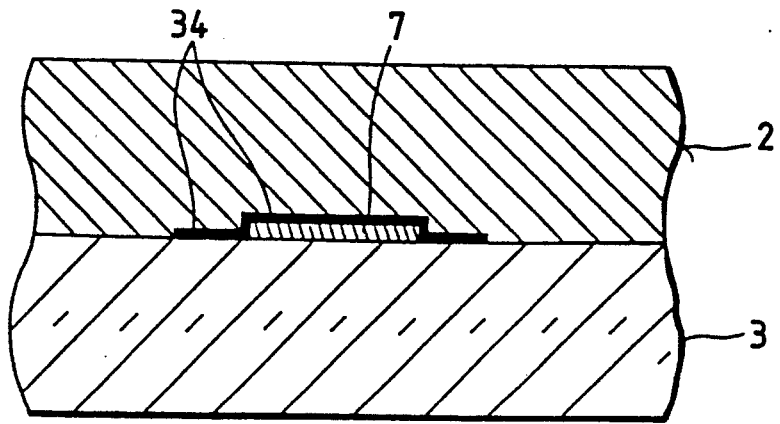
FIG. 10 is a cross section of the lead leading out portion including the lower glass plate taken along the line b—b in FIG. 8.
Figure 11:
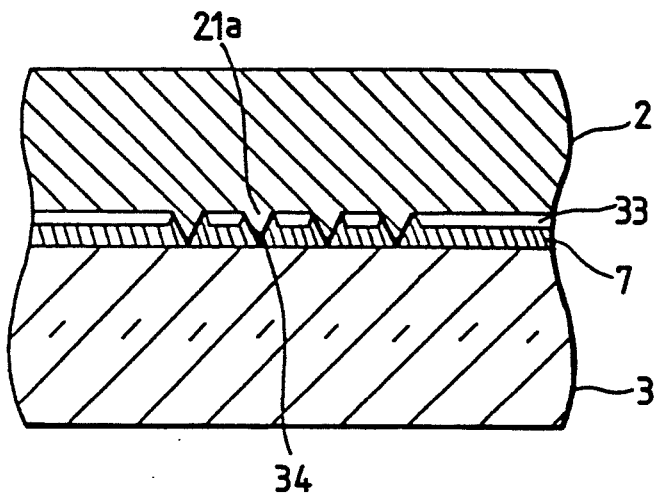
FIG. 11 is a cross section of the lead leading out portion including the lower glass plate taken along the line c—c in FIG. 8.
Figure 12:
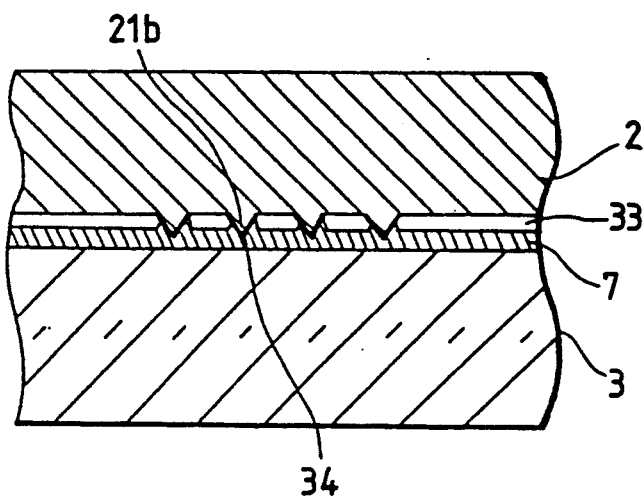
FIG. 12 is a cross section of the lead leading out portion including the lower glass taken along the line d—d in FIG. 8.

Now, the lead leading out portion A indicated in FIG. 3 is explained in detail with reference to FIG. 8 through FIG. 12. A series of rectangular shaped projections 21 consisting of portions 21a and 21b having an insulating layer thereon is formed on the bottom face of the intermediate silicon plate 2 via anisotropic etching. The level of the tops of the rectangular shaped projections 21a is determined as same as that of the bottom face of the intermediate silicon plate 2. In the drawing, the region B indicates the portion where the lead 7 passes. The cross sections corresponding to the lines a—a, b—b, c—c and d—d indicated in FIG. 8 are respectively shown in FIG. 9, FIG. 10, FIG. 11 and FIG. 12. As shown in FIG. 9, at the a—a line cross section, there is a clearance 33 between the lead 7 and intermediate silicon plate 2, no sealing is achieved at this position. Contrary, at the b—b line cross section as shown in FIG. 10, no clearance between the lead 7 and the intermediate silicon plate 2 exists and the lead leading out portion is hermetically sealed. Further with the insulating film 34 formed on the rectangular shaped projections 21 the lead 7 is electrically insulated from the intermediate silicon plate 2. As shown in FIG. 11 and FIG. 12, the triangular shaped projections 21a and 21b partially force collapse the corresponding portion of the lead 7 to thereby form satisfactory hermetic seal thereat.

Figure 13:
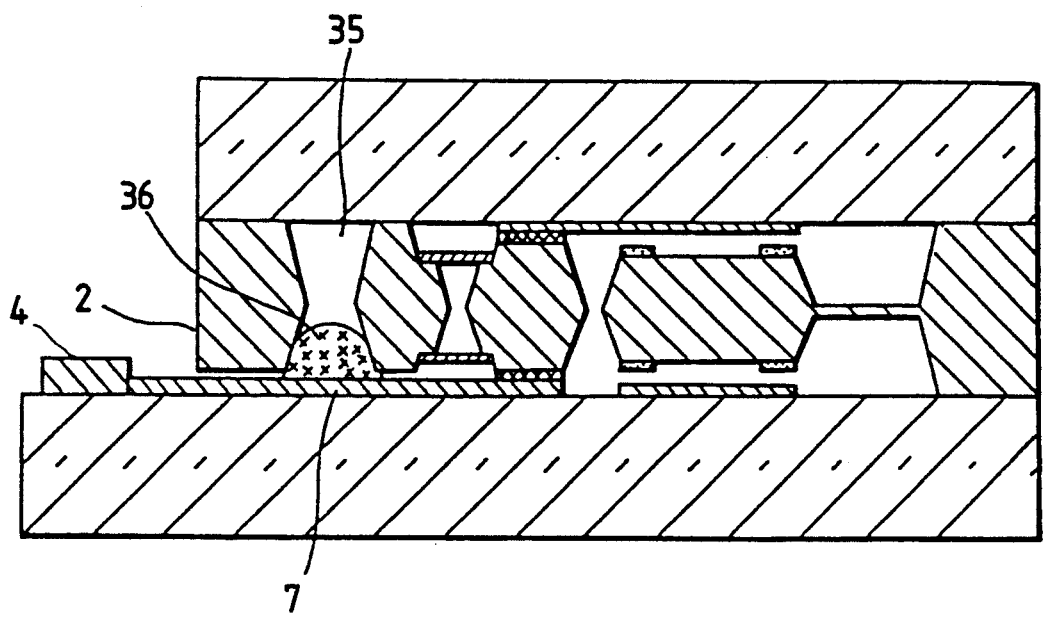
FIG. 13 is a cross section of another embodiment of a capacitive type semiconductor accelerometer according to the present invention corresponding to the cross section shown in FIG. 3.
Figure 14:
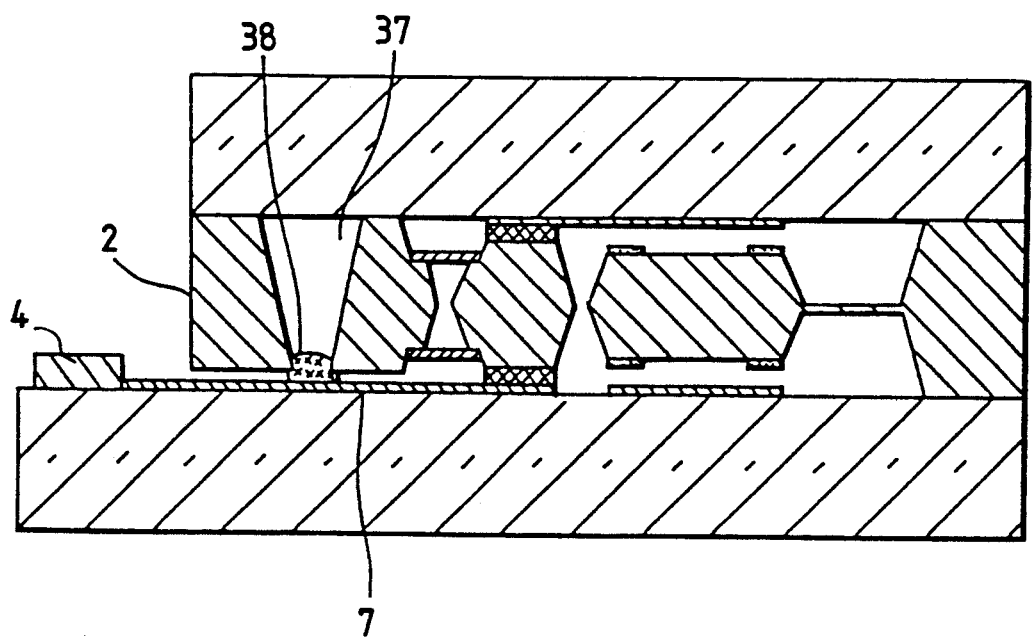
FIG. 14 is a cross section of still another embodiment of a capacitive type semiconductor accelerometer according to the present invention corresponding to the cross section shown in FIG. 3.

FIG. 13 and FIG. 14 show cross sections corresponding to FIG. 3 of other embodiments of capacitive type semiconductor accelerometers according to the present invention wherein only the lead leading out portions corresponding to the portion A indicated in FIG. 3 are modified. Application of reference numerals to the same or equivalent elements as in the first embodiment are mostly omitted for clarity.

In the second embodiment shown in FIG. 13, the hermetic seal at the lead leading out portion is realized by forming an aperture 35 in the intermediate silicon plate 2 via anisotropic etching and by sealing the aperture 35 with an insulating material 36 such as a low melting point glass. When silicone rubber is used for the insulating material a satisfactory hermetic seal at the lead leading out portion can not be expected, however the water and dust intrusion is prevented during dicing operation to obtain the respective detecting chips.

In the third embodiment shown in FIG. 14, the intermediate silicon plate 2 is provided with an aperture 37 of which diameter continuously decreases toward the bottom thereof via anisotropic etching. In this instance, the bottom portion of the aperture 37 is fully closed using an insulating material 38 by sputtering or by chemical vapor deposition to thereby realize a hermetic seal between the intermediate silicon plate 2 and the lead 7.

In the case of the detecting portion shown in FIG. 3, the three layers of the upper glass plate 1, intermediate silicon plate 2 and lower glass plate 3 are simultaneously anodic bonded. On the other hand, in the case of the detection portions shown in FIG. 13 and FIG. 14, at first the intermediate silicon plate 2 and the lower glass plate 3 are bonded together via anodic bonding, subsequently, the insulating material is filled into the apertures 35 and 37 and finally the upper glass plate 1 is bonded via anodic bonding to the already bonded laminate of the intermediate silicon plate 2 and the lower glass plate 3. Namely, in these embodiments it is necessary to perform the anodic bonding operation twice.

Figure 15:
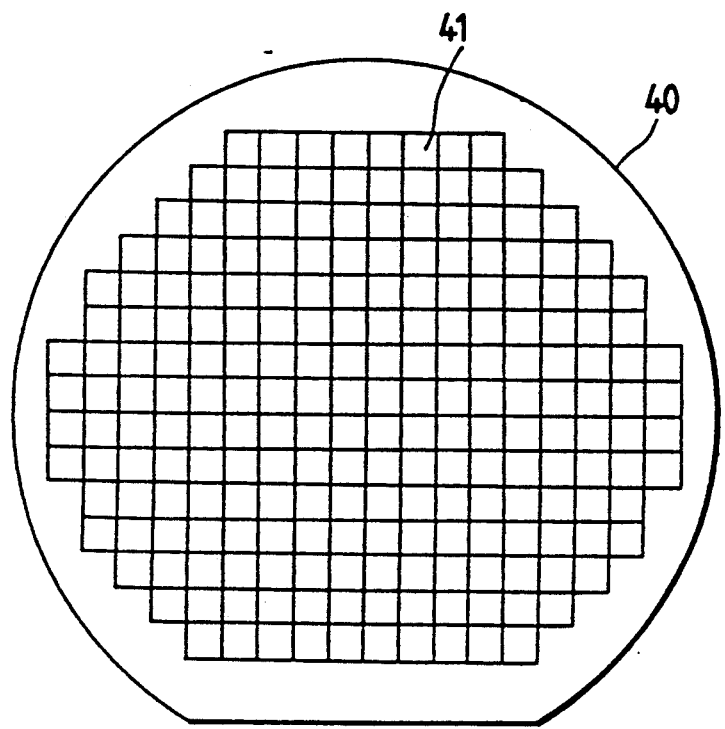
FIG. 15 is a plane view of a water before a dicing operation which includes an array of detecting chips for capacitive type semiconductor accelerometers according to the present invention completed after an anodic bonding operation.
Figure 16:
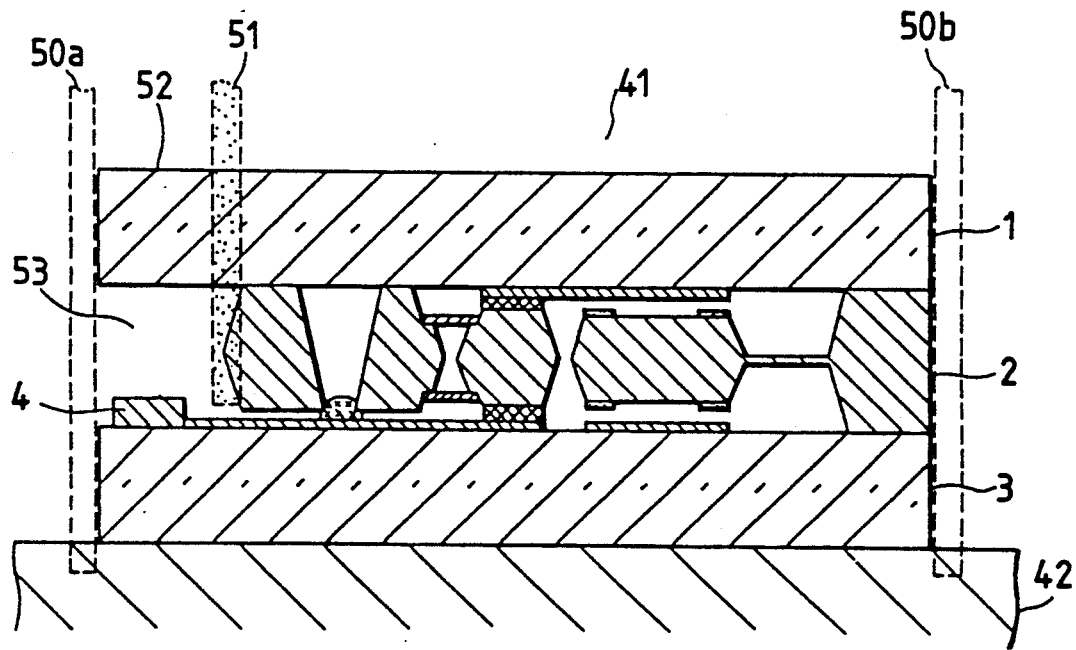
FIG. 16 is a cross section of a part of the wafer shown in FIG. 15 explaining the dicing operation for obtaining from the wafer respective detecting chips for capacitive type semiconductor accelerometers according to the present invention.

Now, a dicing operation for obtaining detecting chips for the capacitive type semiconductor accelerometers according to the present invention is explained. FIG. 15 shows an arrangement of the detecting chips after completing the anodic bonding. As seen from the drawing, multiplicity of detecting chips 41 are arranged in a wafer 40. FIG. 16 is a cross section of a part of the wafer shown in FIG. 15 for explaining the dicing operation for obtaining the detecting chips according to the present invention. The detecting chip shown in the drawing before dicing operation corresponds to that shown in FIG. 14, however the dicing operation is substantially the same for the detecting chips shown in FIG. 3 and FIG. 13. In the intermediate silicon plate 2 a cavity 53 is formed previously via anisotropic etching. Before the dicing operation a portion 52 forming a part of the upper glass plate 1 extends over the cavity 53. After fixing on a die 42 the wafer 40 constituted by a three layered lamination body of the upper glass plate 1, intermediate silicon plate 2 and lower glass plate 3, the wafer 40 is cut into the detecting chips with a dicer. 50a and 50b show positions where the three layered lamination body is completely cut off with dicers having proper blade width and 51 shows a position where the portion 52 of the upper glass plate 1 and a part of the intermediate silicon plate 2 are cut off. Via the dicing operation the portion 52 of the upper glass plate 1 is removed and the upper portion of the lower glass plate 3 on which pads 4, 5 and 6 are disposed is uncovered. The cutting off operation of the portion 52 by dicing is equivalent to the aperture formation in the upper glass plate 1 at the portion 52 such that all of the previous aperture formation in the upper glass plate 1 is eliminated thereby mass productivity of the accelerometers of the present invention is extremely enhanced.

Figure 17:
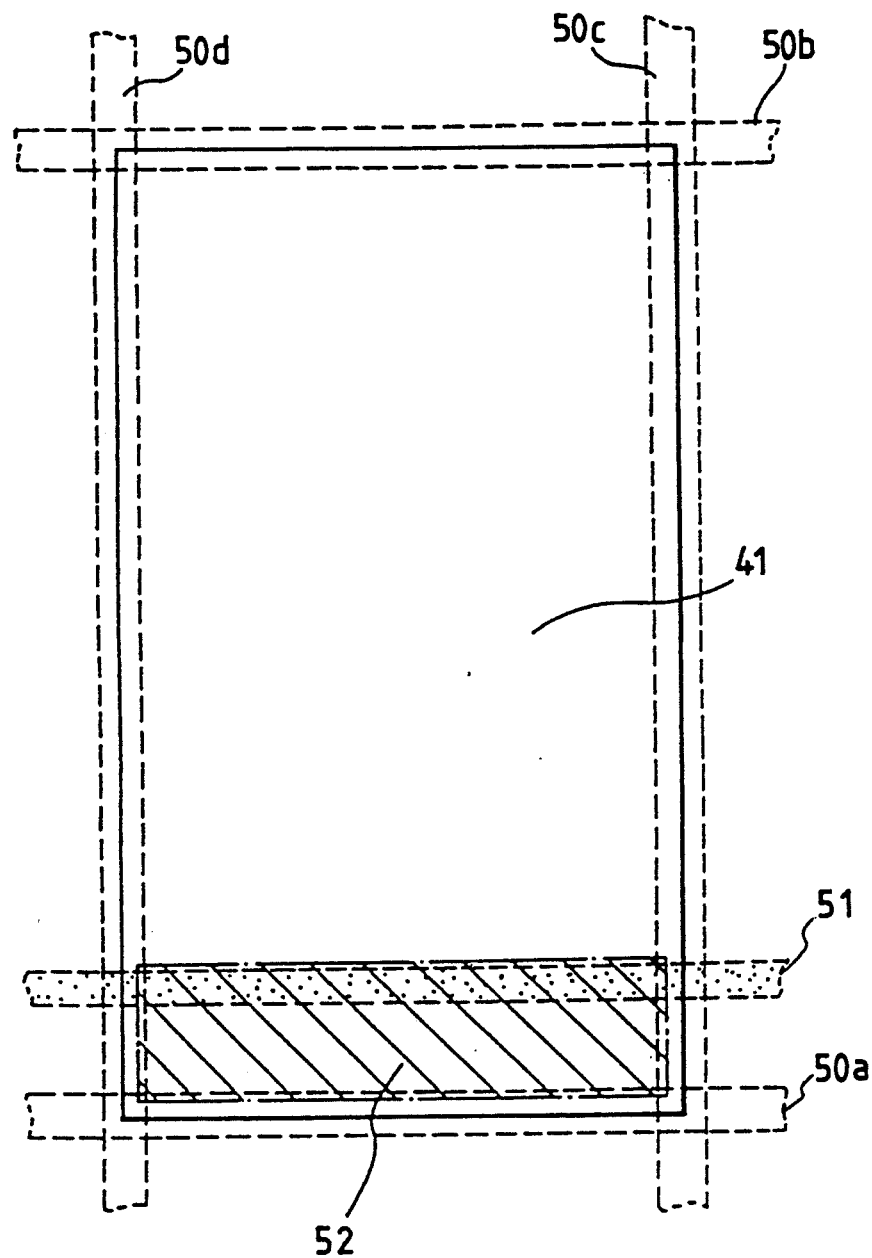
FIG. 17 is a plane view of a part of the wafer shown in FIG. 15 for explaining the dicing operation for obtaining from the wafer respective detecting chips for capacitive type semiconductor accelerometers according to the present invention.

FIG. 17 is a plane view of a part of the wafer 40 shown in FIG. 15 for explaining the dicing operation for obtaining the detecting chips according to the present invention. In the drawing, 50a, 50b, 50c and 50d show the positions where the wafer is completely cut, 51 shows the position where the wafer is partly cut and the portion 52 indicated by hatching is the portion removed from the upper glass plate 1 via dicing operation to uncover the pad portions disposed on the lower glass plate 3.

We claim:

1. A capacitive type semiconductor accelerometer comprising:
    an intermediate silicon plate;
    a movable electrode constituting a pendulum mass formed within said intermediate silicon plate and supported thereby via a beam so as to permit movement into direction substantially perpendicular to its plane;
    a first conductive island formed within said intermediate silicon plate and immovably supported thereby via a first leg;
    an upper glass plate bonded to said intermediate silicon plate;
    a first stationary electrode formed on said upper glass plate at the position facing to one face of said movable electrode with a predetermined gap;
    a lower glass plate bonded to said intermediate silicon plate;
    a second stationary electrode formed on said lower glass plate at the position facing to the other face of said movable electrode with a predetermined gap; and
    a first, second and third pad being disposed on said lower glass plate at the outside of said intermediate silicon plate, said first pad being electrically connected to said first stationary electrode via a first thin film lead formed on said lower glass plate and said first conductive island, said second pad being electrically connected to said movable electrode via a second thin film lead formed on said lower glass plate and said intermediate silicon plate and said third pad being electrically connected to said second stationary electrode via a third thin film lead formed on said lower glass plate.

2. A capacitive type semiconductor accelerometer according to claim 1, wherein said first leg is constituted by an insulating material selected from the group consisting of thermal oxides and silicon nitride.

3. A capacitive type semiconductor accelerometer according to claim 1 further comprising;
    a second conductive island formed within said intermediate silicon plate and immovably supported by said intermediate silicon plate via a second leg.

4. A capacitive type semiconductor accelerometer according to claim 3, wherein said intermediate silicon plate is an n type semiconductor.

5. A capacitive type semiconductor accelerometer according to claim 4, wherein said first and second legs are constituted by a P++ element obtained by diffusing an impurity material into the corresponding portions of said intermediate silicon plate.

6. A capacitive type semiconductor accelerometer according to claim 1, wherein said movable electrode is provided with insulating films at the corners on the both faces facing respectively to said first and second stationary electrodes.

7. A capacitive type semiconductor accelerometer according to claim 1, wherein said intermediate silicon plate is provided with first and second series of triangular shaped projections coated with an insulating film on the surfaces facing respectively to said first and third thin film leads, said series of triangular shaped projections being forced into said first and third thin film leads during bonding operation of said intermediate silicon plate and said lower glass plate thereby to hermetically seal between said intermediate silicon plate and said lower glass plate as well as to electrically isolate therebetween.

8. A capacitive type semiconductor accelerometer according to claim 7, wherein said intermediate silicon plate is n type conductivity and is provided with a n+ type region on the surface facing to said second thin film lead.

9. A capacitive type semiconductor accelerometer according to claim 1, wherein said intermediate silicon plate is provided with first and second apertures at the positions facing to said first and third thin film leads, and said first and second apertures are closed with an insulating material to thereby hermetically seal between said intermediate silicon plate and said lower glass plate and as well as to electrically isolated therebetween.

10. A capacitive type semiconductor accelerometer according to claim 9, wherein said first and second apertures are closed by a sputtering or a chemical vapor deposition operation.

11. A capacitive type semiconductor accelerometer according to claim 9, wherein said insulated material is selected from the group consisting of low melting point glasses and silicone rubber.

* * * * *